United States Patent [19]

Cogan et al.

[11] Patent Number: 4,835,586
[45] Date of Patent: May 30, 1989

[54] DUAL-GATE HIGH DENSITY FET

[75] Inventors: Adrian I. Cogan, San Jose; Richard A. Blanchard, Los Altos, both of Calif.

[73] Assignee: Siliconix Incorporated, Santa Clara, Calif.

[21] Appl. No.: 99,452

[22] Filed: Sep. 21, 1987

[51] Int. Cl.$^4$ .................... H01L 29/78; H01L 29/80; H01L 29/06
[52] U.S. Cl. ................... 357/23.14; 257/23.4; 257/22; 257/55
[58] Field of Search .............. 357/23.4, 23.14, 22 D, 357/22 E, 55

[56] References Cited

U.S. PATENT DOCUMENTS

| | | | |
|---|---|---|---|
| 3,518,509 | 6/1970 | Cullis | 317/235 |
| 4,060,821 | 11/1977 | Houston et al. | 357/22 D |
| 4,101,922 | 7/1978 | Tihanyi et al. | 357/23.4 |
| 4,129,879 | 12/1978 | Tantraporn et al. | 357/22 E |
| 4,329,772 | 5/1982 | Oikawa et al. | 357/23.4 |
| 4,345,265 | 8/1982 | Blanchard | 357/23 |
| 4,375,124 | 3/1983 | Cogan | 29/571 |
| 4,470,059 | 9/1984 | Nishizawa et al. | 357/23.4 |
| 4,476,622 | 10/1984 | Cogan | 29/571 |
| 4,520,552 | 6/1985 | Arnould et al. | 29/571 |
| 4,543,706 | 10/1985 | Bencuya et al. | 29/571 |
| 4,566,172 | 1/1986 | Bencuya et al. | 29/571 |
| 4,587,712 | 5/1986 | Baliga | 357/22 E |

FOREIGN PATENT DOCUMENTS

| | | | |
|---|---|---|---|
| 55-146976 | 11/1980 | Japan | 357/23.4 |
| 56-58267 | 5/1981 | Japan | 357/23.4 |
| 58-50752 | 3/1983 | Japan | |

OTHER PUBLICATIONS

Baliga "Modern Power Devices", published by John Wiley & Sons, pp. 175-182.
Kajiwara et al. "High Speed High Voltage Static Induction Thristor", IEEE International Electronic Devices Meeting, 1977, pp. 38-41.
Nakamura et al., "Very High Speed Static Induction Thyristor", IEEE Transactions on Industry Applications, vol. IA-22, No. 6, Nov./Dec., 1986, pp. 1000-1006.
Houston et al. "A Field Terminated Diode", IEEE Transactions on Electron Devices, vol. ED-23, No. 8, Aug. 1976, pp. 905-911.
Adler, "Factors Determining Forward Voltage Drop in the Field-Terminated Diode (FTD)", IEEE Transactions on Electron Devices, vol. ED-25, No. 5, May, 1978, pp. 529-537.
Wang, "Laterally Symmetrical, Nonuniformly Doped MOS Devices" IBM Technical Disclosure Bulletin, vol. 22, No. 1, Jun. 1979.

Primary Examiner—J. Carroll
Assistant Examiner—Ngan Van Ngo
Attorney, Agent, or Firm—Skjerven, Morrill, MacPherson, Franklin & Friel

[57] ABSTRACT

A dual-gate vertical field effect transistor comprises an N+ substrate (102) which serves as a drain, and N-epitaxial layer (104) formed on the N+ substrate, and an N+ layer (106) formed at the surface of the epitaxial layer which serves as a source. A plurality of grooves (108a, 108b) extends through the N+ region and a portion of the N-layer. The grooves are lined with an insulating layer (110a, 110b) and filled with a conductive polysilicon gate (112a, 112b). Underneath each of the grooves is a P+ region (116a, 116b) which serves as a second gate. Thus, the transistor in accordance with the present invention includes a set of polysilicon gates and a set of P+ gates for independently modulating the current permitted to flow between the transistor source and drain.

8 Claims, 14 Drawing Sheets

DUAL-GATE HIGH DENSITY FET

BACKGROUND OF THE INVENTION

This invention relates to vertical field effect transistors.

Vertical junction field effect transistors are well known in the art. An example of such a transistor is discussed in U.S. Pat. No 4,476,622 issued to Cogan, and U.S. Pat. Nos. 4,543,706 and 4,566,172 issued to Bencuya, et al. In the processes discussed in these patents, an N− expitaxial layer is grown on an N+ substrate, and an N+ region is formed at the surface of the N− epitaxial layer. The N+ region serves as a transistor source and the N+ substrate serves as the drain. A plurality of grooves is then etched through the N+ layer and into a portion of the N− epitaxial layer. A P+ gate region is formed in the N− epitaxial layer at the bottom of the grooves. The size of the depletion region between the P+ gate region and the N− epitaxial layer is modulated by application of selected voltages to the P+ gate region. By modulating the size of this depletion region, the current between the N+ layer at the surface of the epitaxial layer and the N+ substrate can be controlled.

SUMMARY OF THE INVENTION

A dual gate vertical transistor constructed in accordance with our invention includes two gate structures for independently modulating the current flowing between the source and drain regions. In one embodiment, the transistor comprises an N+ substrate which serves as the transistor drain, an N− epitaxial layer formed on the N+ substrate, and an N+ source region formed at the surface of the epitaxial layer. (The present description is directed towards an N channel device. However, a P channel device can be formed by reversing the conductivity types of the regions described herein.) A plurality of grooves are formed extending through the N+ source layer at the surface of the epitaxial layer and into the N− epitaxial layer. Thereafter, P type impurities are introduced into the portion of the epitaxial layer at the bottom of the grooves to form a P+ gate structure. The walls of the groove are then thermally oxidized, to thereby form an insulation layer. Thereafter, the grooves are filled with doped polysilicon which functions as a second gate structure.

The P+ gate structure and the polysilicon gate structure are each electrically contacted to permit independent modulation of the source-drain current. Thus, the dual gate vertical transistor is more versatile than the above-mentioned prior art vertical junction field effect transistors. This increase in versatility is achieved without a large increase in the transistor surface area.

The dual data transistor of the present invention is useful in applications such as AC or RF signal modulation, signal mixing, automatic gain control amplification and overvoltage or overcurrent protection devices in power control circuits.

DETAILED DESCRIPTION OF THE DRAWINGS

Figure 1:
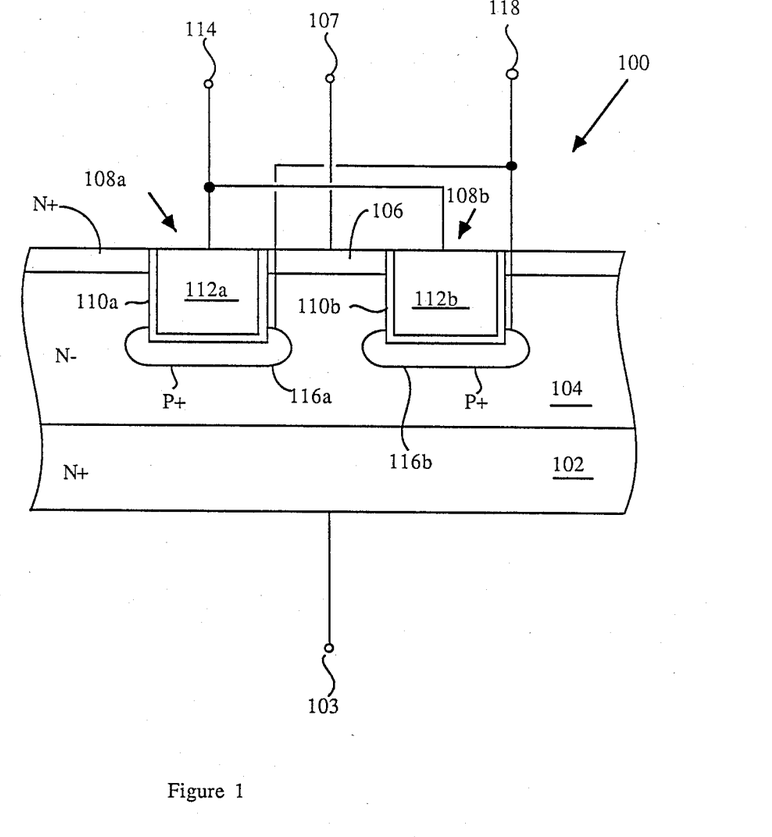
FIG. 1 illustrates in cross section a transistor constructed in accordance with one embodiment of our invention.

FIG. 1 illustrates a transistor 100 constructed in accordance with one embodiment of our invention. Referring to FIG. 1, transistor 100 includes an N+ substrate 102 and an N− epitaxial layer 104 formed on substrate 102. An N+ layer 106 is formed at the surface of epitaxial layer 104. N+ substrate 102 serves as the drain of transistor 100 and is coupled to a drain lead 103, while N+ layer 106 serves as the transistor source and is connected to source lead 107. A pair of grooves 108a and 108b extend through N+ region 106 and into N− epitaxial layer 104. Formed in groove 108a is a silicon dioxide layer 110a and a polysilicon gate 112a. Of importance, silicon dioxide 110a insulates polysilicon gate 112a from N− epitaxial layer 104 and N+ region 106. Similarly, formed within groove 108b is a silicon dioxide layer 110b and a polysilicon gate 112b. Although illustrated as two separate regions, in one embodiment, gates 112a and 112b are a single contiguous region joined outside the plane of the cross-section of FIG. 1. However, in another embodiment, polysilicon gates 112a and 112b are merely electrically connected together and to a gate contact lead 114. Formed underneath grooves 108a and 108b are P+ gate regions 116a and 116b, respectively. Of importance, gate regions 116a and 116b are electrically insulated from polysilicon gates 112a and 112b by silicon dioxide layers 110a and 110b, respectively.

In one embodiment of the invention, P+ gates 116a and 116b are also a contiguous structure joined outside the cross-section plane of FIG. 1. However, in another embodiment, gates 116a and 116b are merely electrically coupled to a common gate lead 118. The manner in which gates 116a and 116b are coupled to lead 118 is described below.

A depletion region forms between P+ region 116a and surrounding N− epitaxial layer 104 and between P+ region 116b and layer 104. Of importance, the size of this depletion region can be modulated by application of appropriate voltages to gates 116a and 116b via gate lead 118. By controlling the size of this depletion region, the amount of current permitted to flow between source 106 and drain 102 can be controlled. Thus, this portion of transistor 100 functions as a junction field effect transistor ("JFET").

Similarly, by application of appropriate voltages to gates 112a and 112b, the concentration of N type current carriers in N− epitaxial layer 104 can be increased or decreased, thereby decreasing or increasing the series resistance between source 106 and drain 102. Thus, a vertical field effect transistor constructed in accordance with our invention permits modulation of the transistor current by independent application of two gate voltages to two gate structures. Of importance, this added degree of control over the transistor current is accomplished without having to greatly increase the surface area of the transistor.

In one embodiment, transistor 100 can be operated in a mode whereby the PN junctions between P+ regions 116a, 116b and N− epitaxial layer 104 are forward biased, thereby injecting holes into N− epitaxial layer 104 and reducing the drain-source resistance exhibited by transistor 100. Thus, the portion of transistor 100 including gates 116a, 116b functions as a JFET during the bipolar mode of operation. (The bipolar mode of operation of JFETs is described by B. Jayant Baliga in "Modern Power Devices" published by John Wiley & Sons in 1987, pages 175 to 182, incorporated herein by reference.) The ability to operate device 100 in bipolar mode further adds to the versatility of transistor 100.

Although transistor 100 is illustrated as including only two grooves 108a, 108b with two polysilicon gates 112a, 112b and two P+ gates 116a, 116b, transistor 100 typically comprises a large number of grooves and gate structures constructed to the right of groove 108b and to the left of groove 108a. Thus, for example, the portion of epitaxial layer 104 to the right of groove 108b serves as a portion of the channel of transistor 100 whose current is modulted by the gate structures in groove 108b and identical gate structures in the groove to the right of groove 108b. The portion of epitaxial layer 104 to the left of groove 108a similarly functions as part of the transistor channel.

Figure 2A:
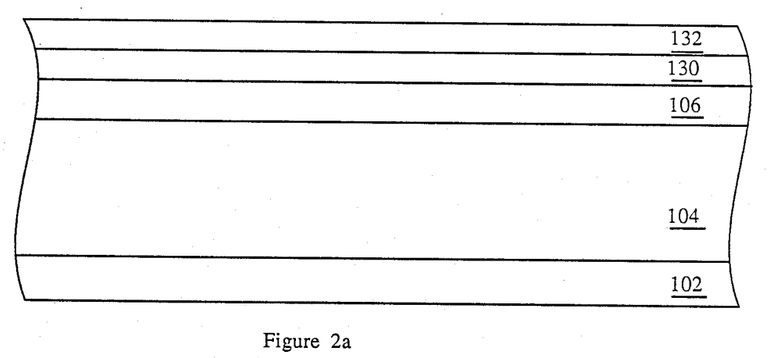
FIGS. 2a to 2h illustrate in cross section the transistor of FIG. 1 during a manufacturing process in accordance with our invention.

A process for manufacturing a transistor in accordance with our invention is illustrated in FIGS. 2a to 2h. Referring to FIG. 2a, the process starts by forming N− layer 104 and N+ layer 106 on an N+ substrate 102. In one embodiment, substrate 102 is N+]silicon having a (100) crystal orientation and a dopant concentration of about $10^{19}$/cc. N− region 104 is also silicon having a dopant concentration of about $10^{14}$ to $10^{17}$/cc and a thickness of 1,000 to 5,000 nm. N+ region 106 has a dopant concentration of about $10^{19}$ to $10^{20}$/cc and a thickness of about 500 to 1,000 nm. In one embodiment, region 104 is formed by epitaxial deposition and region 106 is formed by implantation or diffusion of an appropriate N type impurity into N− epitaxial layer 104. A $SiO_2$ layer 130 is then thermally grown on N+ region 106 to a thickness of approximately 300 to 1,500 nm, and an $Si_3N_4$ layer 132 is formed on $SiO_2$ 130, e.g. to a thickness of 50 nm to 400 nm by chemical vapor deposition.

Figure 2B:
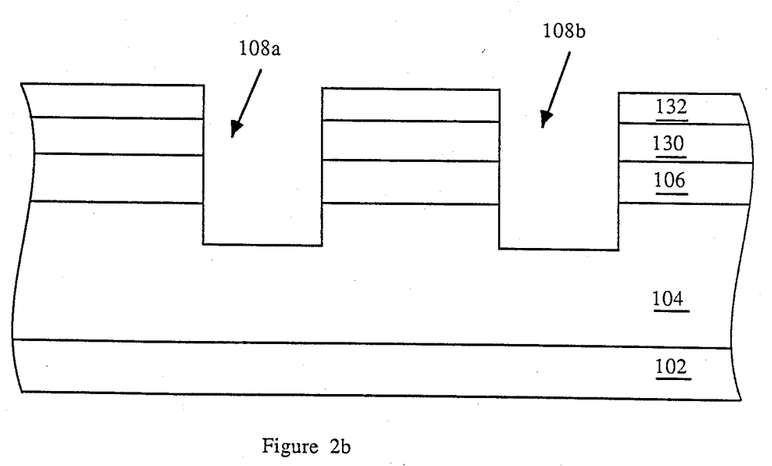

Grooves 108a and 108b are then etched through $Si_3N_4$ layer 132, $SiO_2$ layer 130, N+ layer 106 and a portion of N− region 104. (As mentioned above, other grooves are concurrently formed to the left of groove 112a and to the right of groove 112b. Thus, the structures in FIGS. 2a to 2h are a representative portion of a much larger transistor.) In one embodiment, this is done by applying a photomask to the wafer (not shown), patterning the photomask in a conventional manner to form window regions in the photomask, and etching the portions of layers 132, 130, 106 and 104 within the window regions. This is typically accomplished using a dry etching process such as reactive ion etching or plasma etching. Of importance, the etching process is carefully timed to avoid etching entirely through epitaxial layer 104. The resulting structure is illustrated in FIG. 2b. In one embodiment, grooves 108a and 108b extend to a depth of 0.5 to 2 μm below the interface between layers 104 and 106.

Figure 2C:
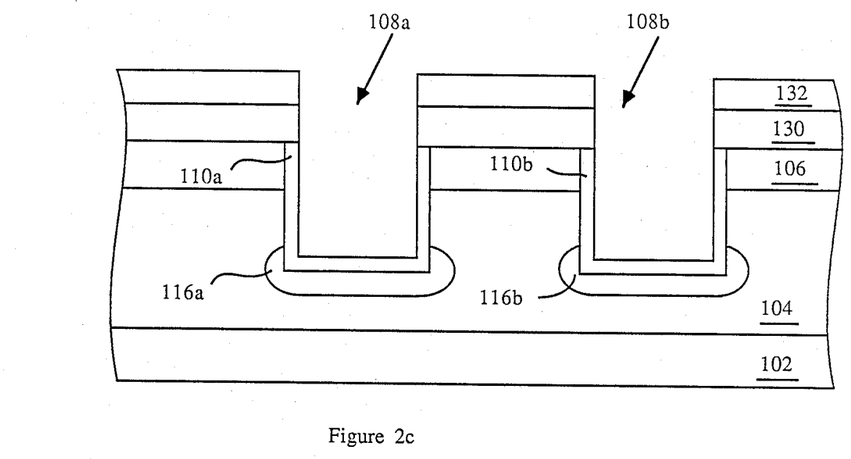

Referring to FIG. 2c, P type impurities are introduced into the bottom of grooves 108a and 108b e.g. by ion implantation. The P type impurities are then diffused, thereby forming P+ gate regions 116a and 116b. In one embodiment, regions 116a and 116b have dopant concentrations of $10^{17}$/cc. Concurrently with this diffusion step, $SiO_2$ layers 110a and 110b are formed on the walls of grooves 108a and 108b, respectively, e.g., to a thickness of 0.1 to 0.5 μm. Of importance, $SiO_2$ layers 110a and 110b insulate N+ region 106 and N− layer 104 from a subsequently formed polysilicon gates.

Figure 2D:
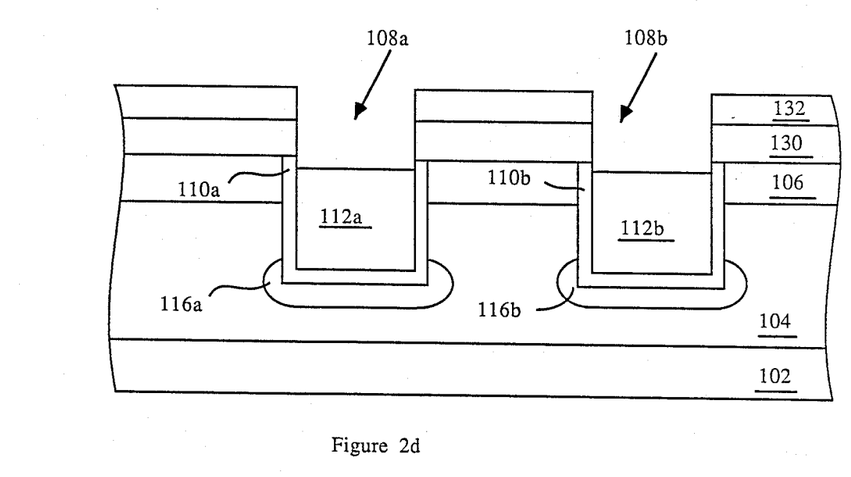

Referring to FIG. 2d, polysilicon gates 112a and 112b are formed in grooves 108a and 108b, respectively. In one embodiment, this is done by depositing thick polysilicon on the entire surface of the wafer and then subjecting the wafer to a vertical etching process to remove all of the polysilicon formed on the wafer except for a portion of the polysilicon formed within grooves 108a and 108a. Of importance, during etching, polysilicon gates 112a, 112b are etched so that the top surface of the polysilicon is approximately 0 to 500 nm between the top surface of N+ region 106. Polysilicon gates 112a, 112b are typically heavily doped.

Figure 2E:
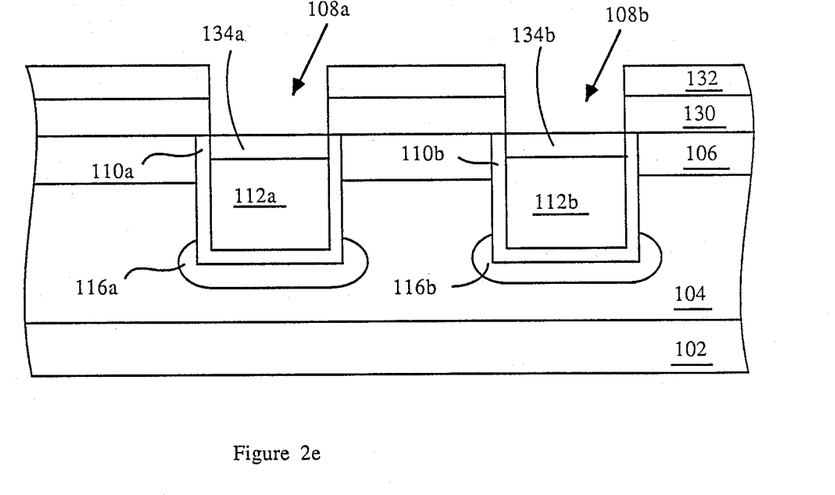

Referring to FIG. 2e, the wafer is then subjected to a thermal oxidation step to selectively form thick $SiO_2$ regions 134a and 134b above polysilicon gates 112a and 112b, respectively. In one embodiment, $SiO_2$ layers 134a and 134b are approximately 0.3 to 1 μm thick and are formed such that the top surface of $SiO_2$ 134a and 134b is coplanar with the upper surface of N+ region 106. $Si_3N_4$ layer 132 prevents the thickness of $SiO_2$ layer 130 from increasing during this step.

Figure 2F:
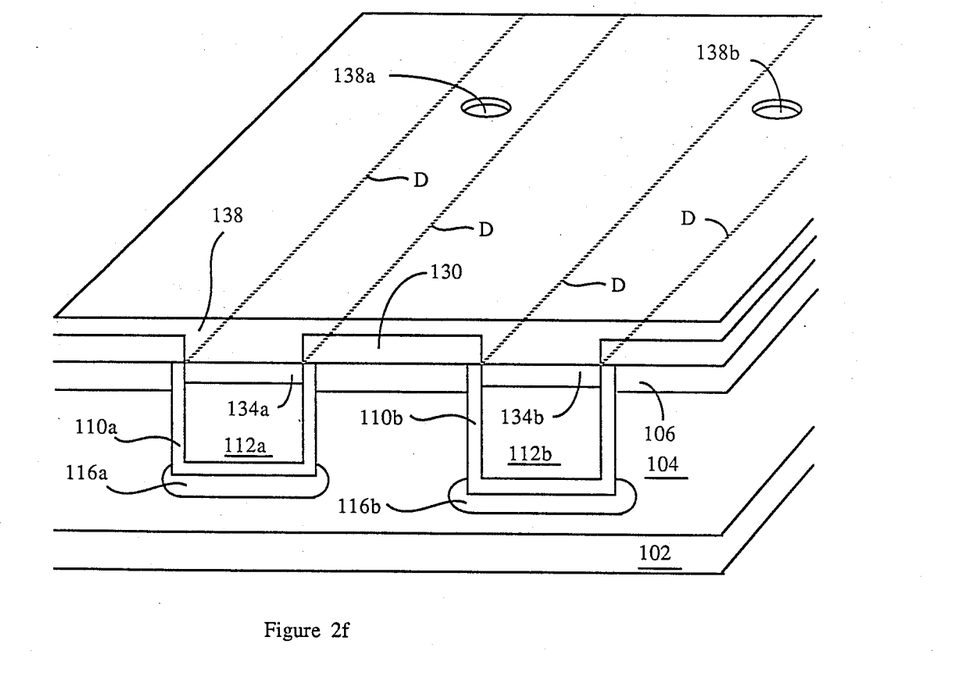

The wafer is subjected to a blanket $Si_3N_4$ etching step to remove $Si_3N_4$ layer 132. In one embodiment, this is done by placing the wafer in a phosphoric acid etching solution. The wafer is then removed from the phosphoric acid etching solution and covered with photoresist 138. Photoresist 138 is patterned to define window regions 138a and 138b where electrical contact to gate regions 112a, 112b is to be made as shown in FIG. 2f. FIG. 2f illustrates to-be-formed transistor-100 in cross-section along the same cross-section plane as FIGS. 2a to 2e, but also illustrates a portion of the top surface of the wafer. Dotted lines D illustrate the lateral extent of grooves 108a and 108b underneath photoresist 138. The portions of $SiO_2$ layers 134a and 134b within window regions 138a and 138b are then removed, e.g., by placing the wafer in a diluted HF etching solution. The wafer is then removed from the HF solution and photoresist layer 138 is removed. The wafer is then covered with a photoresist layer 139 (FIG. 2g) which is patterned such that the portion of photoresist 139 where the source contact metallization is to be formed is removed.

Figure 2G:
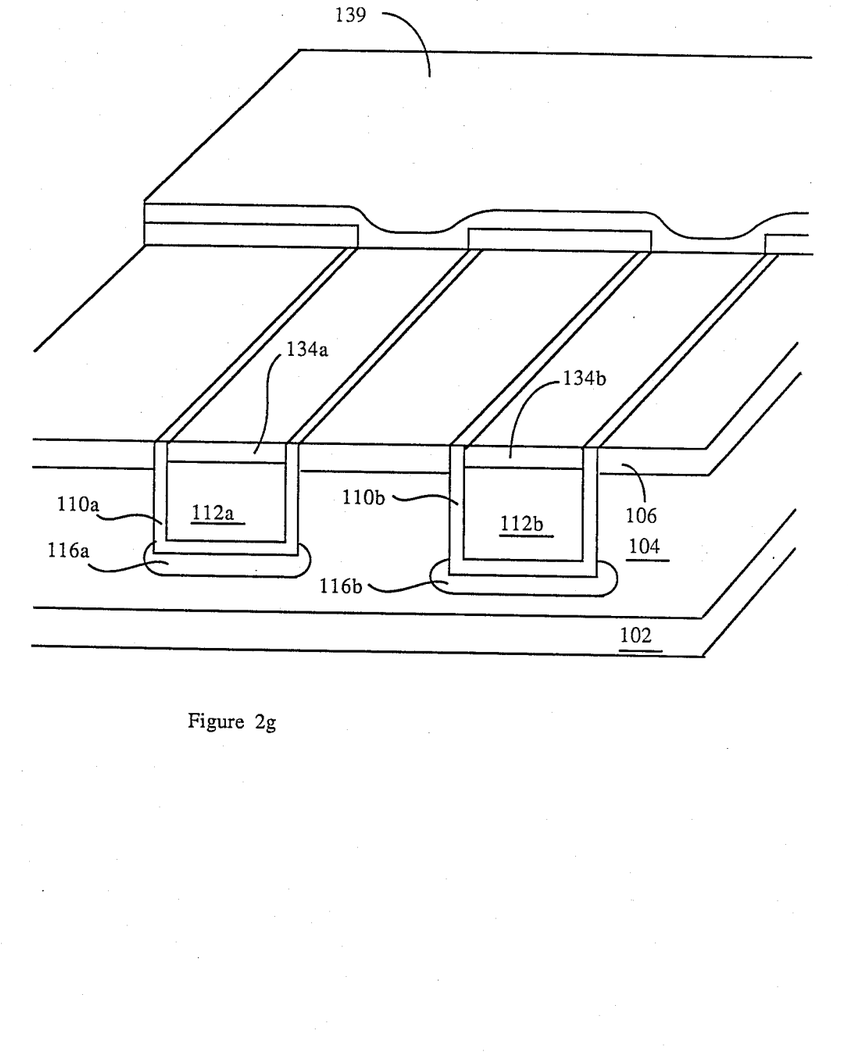

The wafer is then subjected to a $SiO_2$ etching process to remove the exposed portions of $SiO_2$ layer 130. In one embodiment, this is done by placing the wafer in an HF etching solution for a period of time and then removing the wafer from the etching solution. Of importance, because of the thickness of $SiO_2$ layers 134a and 134b only a negligible part of exposed portions of $SiO_2$ 134a and 134b is removed during this step. Photoresist 139 is then removed.

Figure 2H:
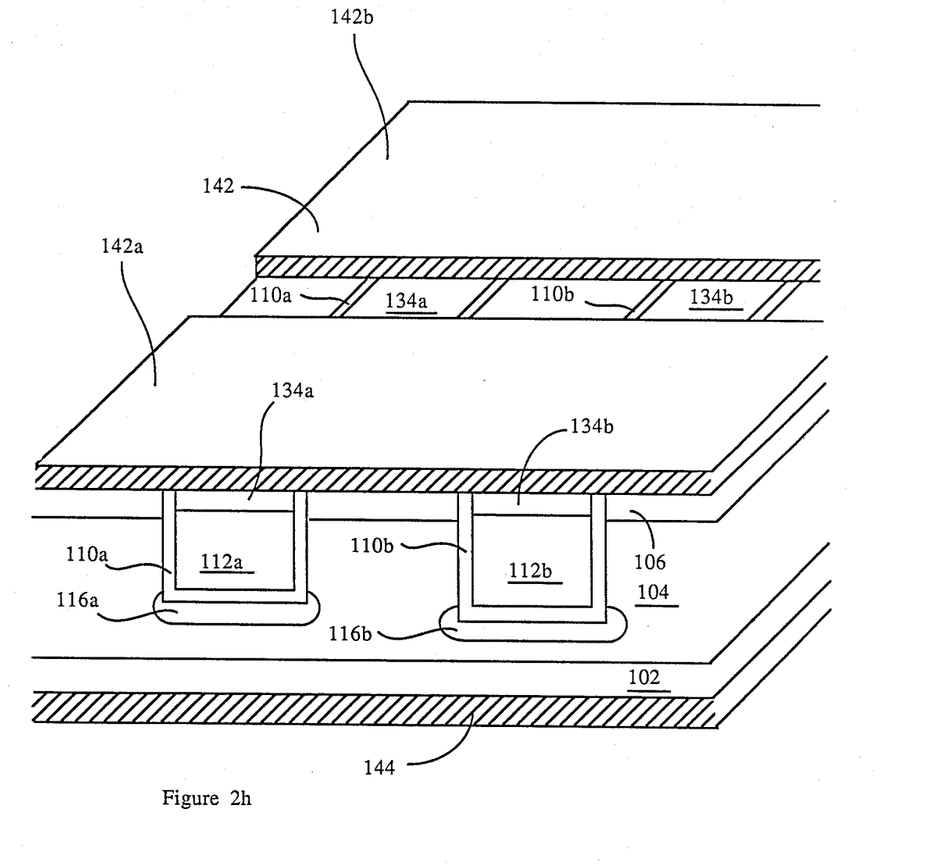

Referring to FIG. 2h, contact metallization 142 is then formed on the top surface of the wafer. In one embodiment, metallization 142 is aluminum or an alloy of aluminum and is formed by evaporation, sputtering or other appropriate technique. Thereafter, contact metallization 142 is patterned such that a first portion 142a of contact metallization 142 electrically contacts source 106, and a second portion 142b of contact metallization 142 electically contacts gates 112a and 112b. Thereafter, drain contact metallization 144 is formed on the bottom side of the wafer, also by evaporation or sputtering.

Figure 3A:
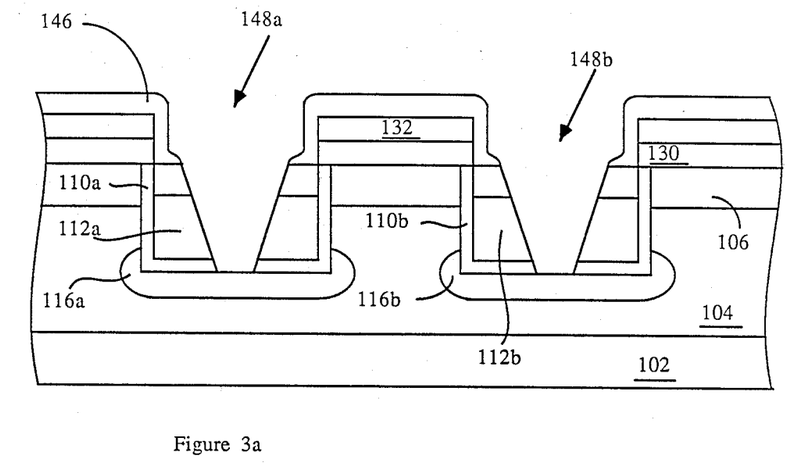
FIGS. 3a to 3e illustrate a portion of the transistor of FIG. 1 along a second cross section plane during manufacturing.

As indicated above, gate regions 116a and 116b are connected to a gate contact 118. Gate contact 118 is typically formed outside the cross section plane of FIGS. 2a to 2h. FIGS. 3a to 3e illustrate in cross section the portion of transistor 100 where gates 116a and 116b are electrically contacted during manufacturing. The process of forming the structure for contacting gates 116a, 116b, typically commences after formation of thick silicon dioxide 134a and 134b (FIG. 2e). After forming oxide 134a and 134b a photomask 146 (FIG. 3a) is applied to the surface of the wafer and then patterned. The wafer is then subjected to a dry etching process (typically plasma or reactive ion etching) to thereby form grooves 148a, 148b extending through $SiO_2$ 134a and 134b, polysilicon 112a and 112b, and $SiO_2$ 110a and 110b. The process parameters of the dry etching process are typically selected to provide a sloped profile (e.g. as illustrated in FIG. 3a). The etching parameters used to achieve a sloped sidewall typically depend on the type of etching apparatus used. In one embodiment, a Triode Etcher, Model Number 606, manufactured by GCA Corp. is used to etch grooves 148a and 148b. The process gas typically comprises $SF_6$, $C_2F_6$, or $CHF_3$, or a mixture thereof, a gas flow rate at about 180 SCCM, a gas pressure of about 135 mTorr, and a plasma bias of about $-450$ V.

Figure 3B:
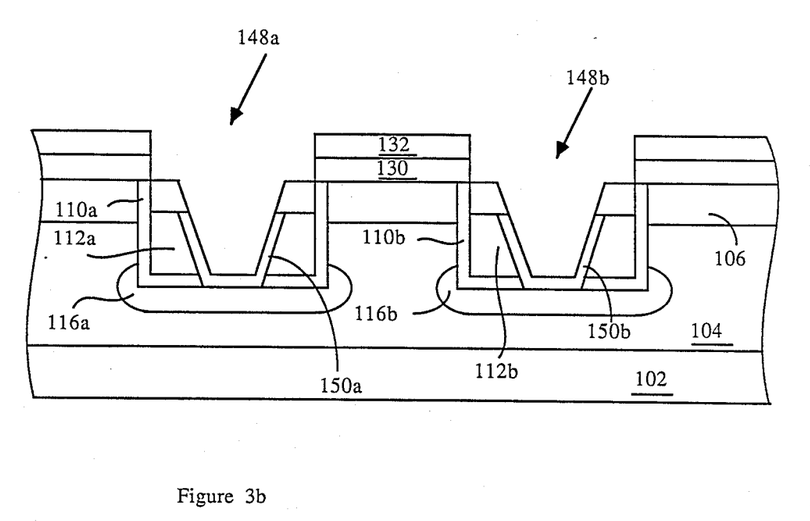

Thereafter, photomask 146 is removed and the wafer is subjected to a thermal oxidation step to form $SiO_2$ layers 150a and 150b on the walls of the grooves 148a and 148b. $SiO_2$ layers 150a and 150b are typically 300 to 800 nm thick. The resulting structure is illustrated in FIG. 3b.

Figure 3C:
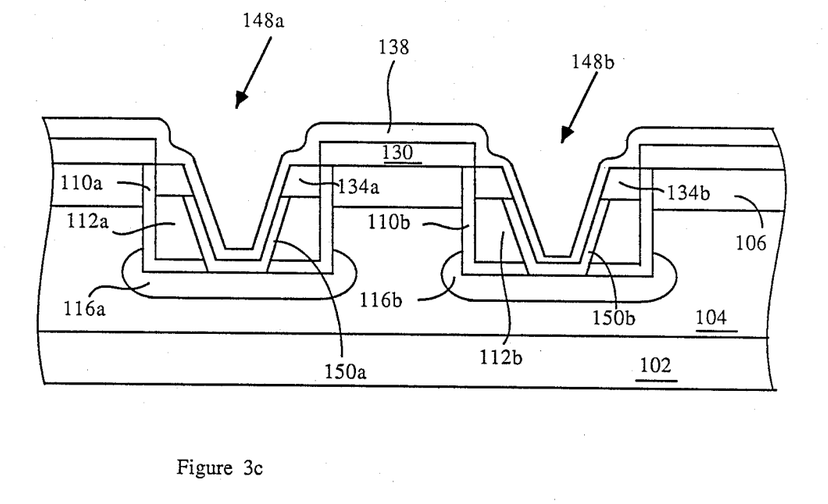

The wafer is then subjected to the $Si_3N_4$ blanket etching process described above and photoresist 138 is applied to the wafer (FIG. 2f). Of importance, photoresist 138 protects $SiO_2$ layers 150a and 150b during the step in which the wafer is placed in the HF solution to etch $SiO_2$ layers 134a and 134b, as illustrated in FIG. 3c. This prevents removal of $SiO_2$ layers 150a and 150b so that layers 150a and 150b can insulate polysilicon 112a and 112b from subsequently deposited metallization.

Figure 3D:
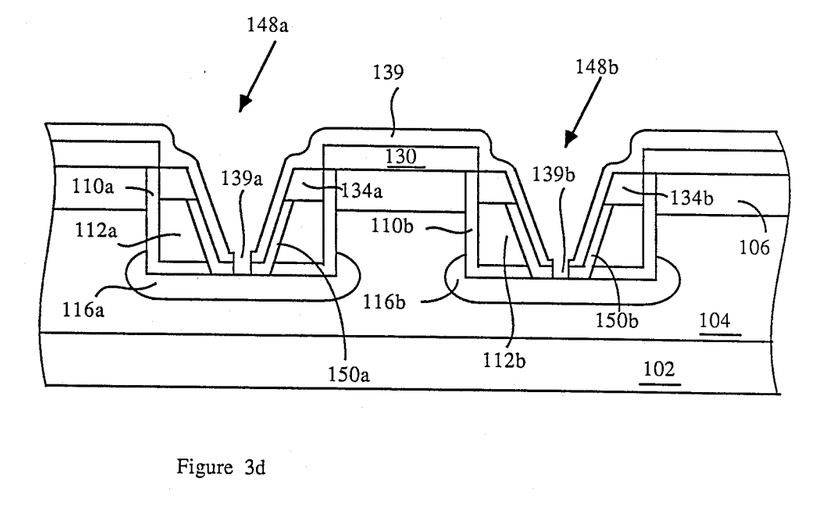

As mentioned above, photoresist layer 138 is removed and the wafer is covered with photoresit layer 139 (FIG. 2g). Of importance, photoresist layer 139 includes window regions 139a and 139b to define where gates 116a and 116b are to be contacted (FIG. 3d). The wafer is then subjected to the $SiO_2$ etching process which results in etching of $SiO_2$ layer 130. Of importance, the exposed portion of $SiO_2$ layers 150a and 150b on the bottom of grooves 148a and 148b is removed during this $SiO_2$ etching step. Photoresist layer 139 is then removed.

Figure 3E:
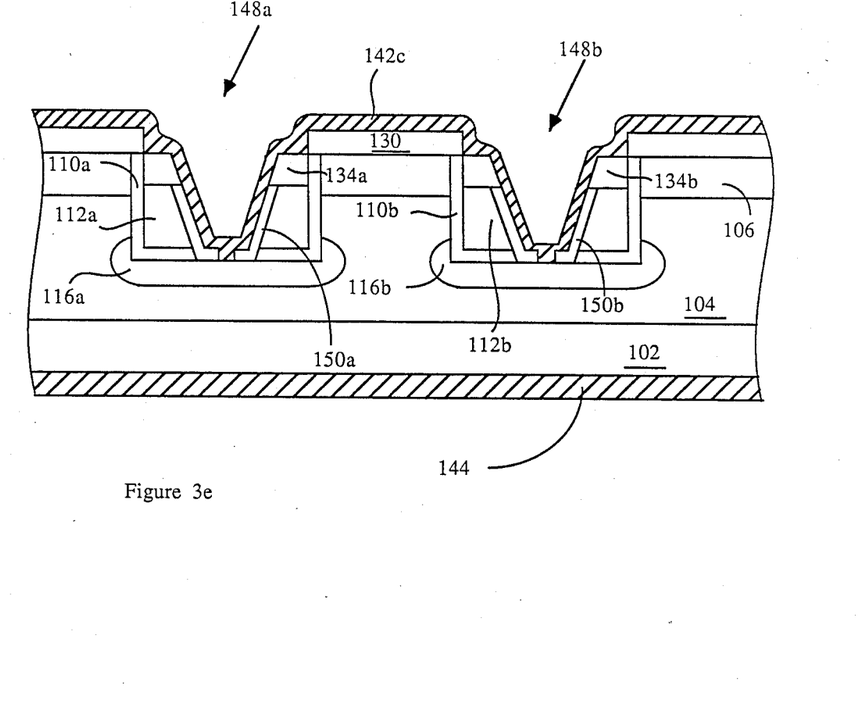

The wafer processing continues as described above. As mentioned earlier, metallization 142 is deposited on the wafer to contact source 106 and gates 112a and 112b. Of importance, a portion 142c of metallization 142 electrically contacts gates 116a and 116b as illustrated in FIG. 3e. During patterning of metallization 142, portion 142c of metallization 142 is patterned so as to not contact portions 142a or 142b of the metallization.

Figure 4A:
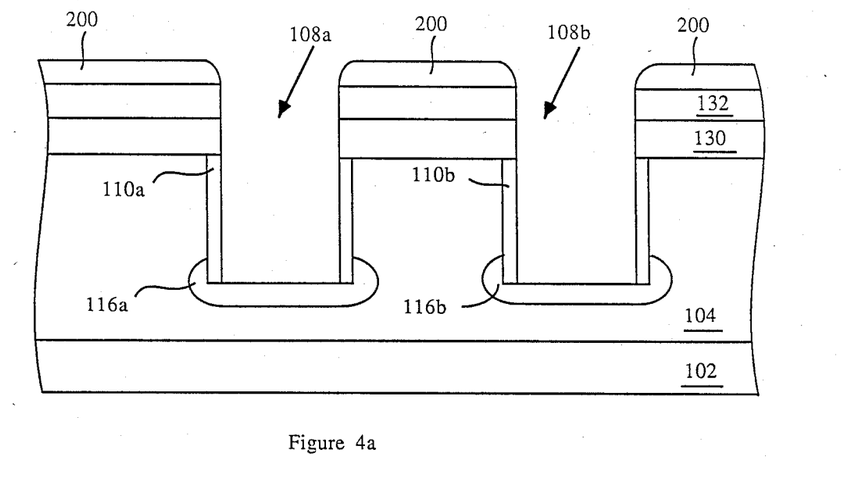
FIGS. 4a to 4d illustrate a portion of the transistor of FIG. 1 along the second cross section plane during a manufacturing process in accordance with an alternative embodiment of our invention.

FIGS. 4a to 4d illustrate in cross section an alternative method for contacting P+ gates 116a and 116b. After growing $SiO_2$ layers 110a and 110b in grooves 108a and 108b (see FIG. 2c), a photomask 200 is formed over the wafer and then patterned to expose a portion of $SiO_2$ 110a and 110b outside of the cross section of FIGS. 2a to 2h. FIG. 4a illustrates the portion of grooves 108a and 108b outside of the cross section of FIGS. 2a to 2h where $SiO_2$ layers 110a and 110b are exposed. (N+ region 106 does not extend to the portion of the wafer illustrated in FIGS. 4a to 4d. The reason for this is described below.) The wafer is then subjected to a vertical etchig process to remove the exposed portion of $SiO_2$ layers 110a, 110b on the bottom of grooves 108a, 108b.

Figure 4B:
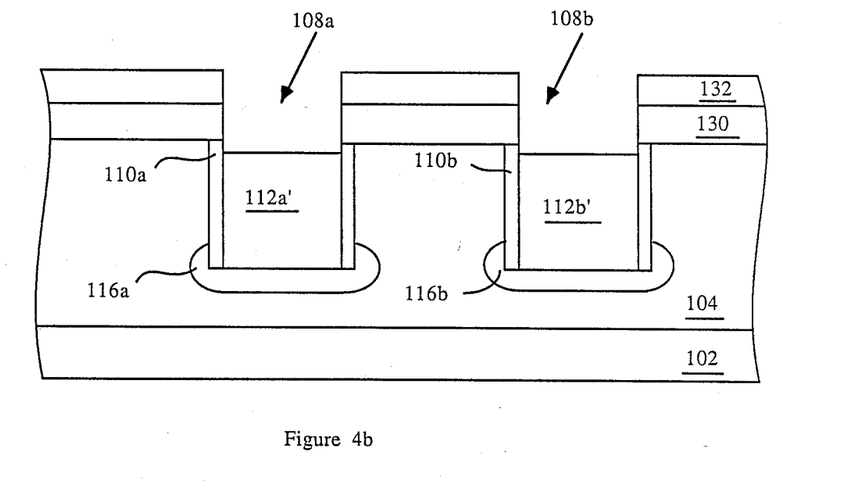

Thereafter, photomask 200 is removed and polysilicon gates 112a, 112b are formed in grooves 108a, 108b as discussed above and illustrated in FIG. 2d. As can be seen in FIG. 4b, polysilicon 112a', 112b' (coextensive with polysilicon 112a, 112b) is concurrently formed in the portion of grooves 108a, 108b in the cross section of FIGS. 4a to 4d. Polysilicon 112a', 112b' electrically contacts underlying P+ regions 116a, 116b respectively.

Figure 4C:
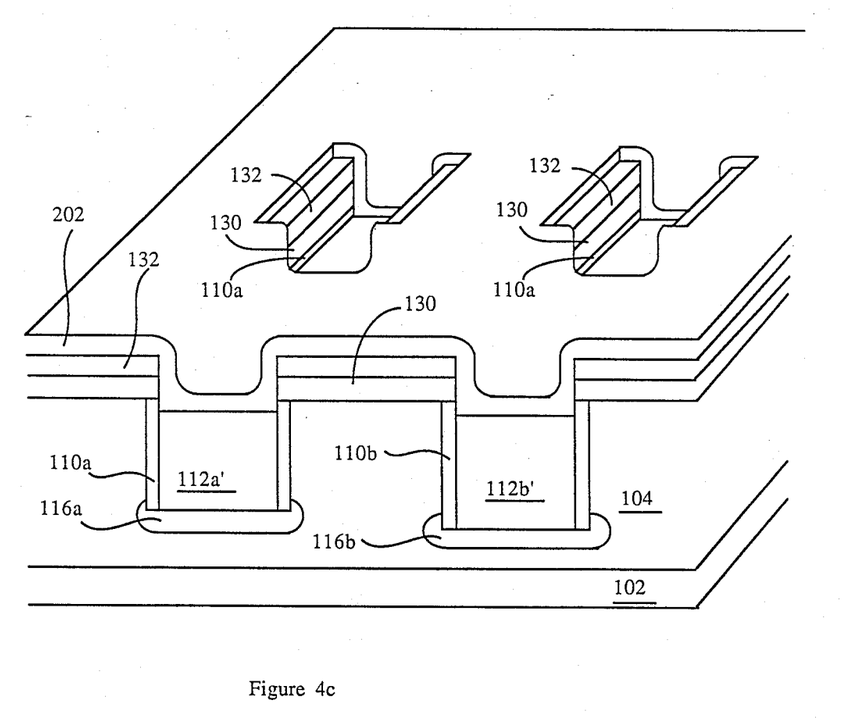

Referring to FIG. 4c, a photoresist layer 202 is then formed on the wafer and patterned to expose a portion of the polysilicon in grooves 108a, 108b. The exposed polysilicon is then removed, e.g. using a vertical or other etching process so, that polysilicon 112a' no longer electrically contacts polysilicon gate 112a and polysilicon gate 112b no longer electrically contacts polysilicon 112b'.

Figure 4D:
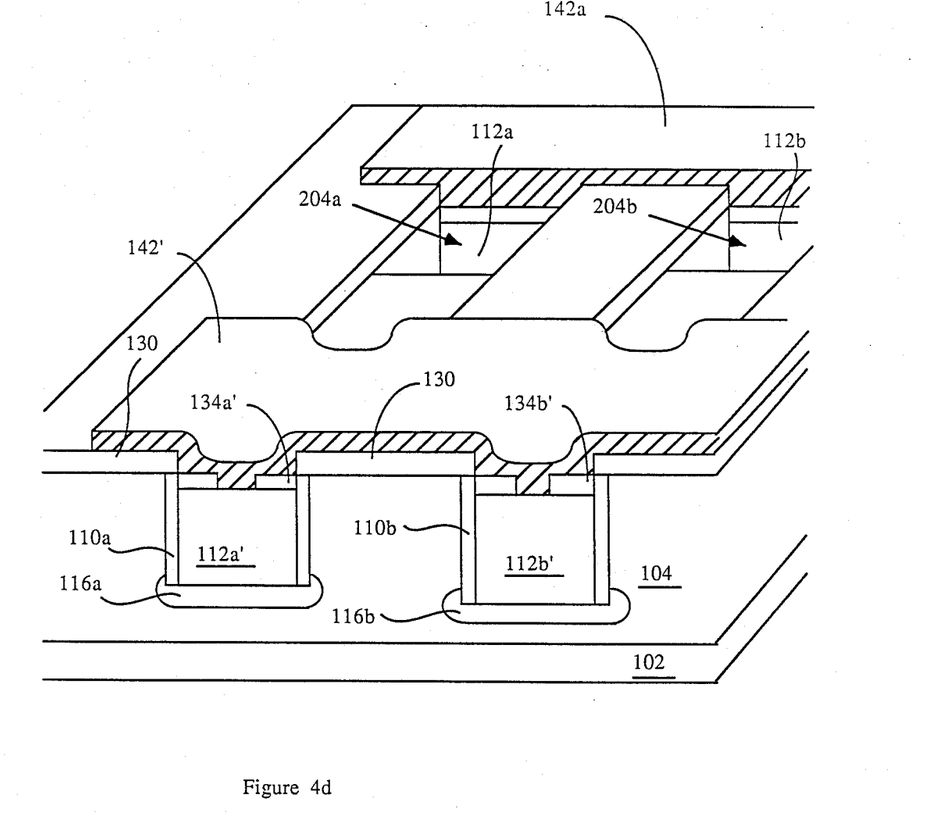

Processing continues as described above, and $SiO_2$ layers 134a and 134b are formed on polysilicon 112a and 112b (FIG. 2e). Concurrently, $SiO_2$ layers 134a' and 134b' are formed on polysilicon 112a' and 112b' (FIG. 4d). Electrical contact holes are then formed in $SiO_2$ layers 134a' and 134b' (concurrently with the contact holes formed in $SiO_2$ 134a and 134b, and contact metallization 142' (formed concurrently with metallization 142a) is deposited on the wafer for contacting polysilicon 112a' and 112b'. Metallization 142b is located outside of the portion of the wafer illustrated in FIG. 4d.

Also illustrated in FIG. 4d are holes 204a, 204b formed during the etching of polysilicon discussed above in relation to FIG. 4c. Holes 204a, 204b separate polysilicon 112a', 112b' from gates 112a, 112b, respectively.

As mentioned above, N+ region 106 does not extend to the cross section of FIGS. 4a to 4d. In the embodiment of FIGS. 4a to 4d, before N+ region 106 is formed, a photomask is applied to the wafer to define the lateral extent of N+ region 106. This photomask prevents N+ region 106 from extending to the cross section plane of FIGS. 4a to 4d. The reason for this is that if the lateral extend of N+ region 106 were not so limited, polysilicon 112a' and 112b' would function as a third gate coupled in parallel with gates 112a, 112b.

Figures 5, 6:
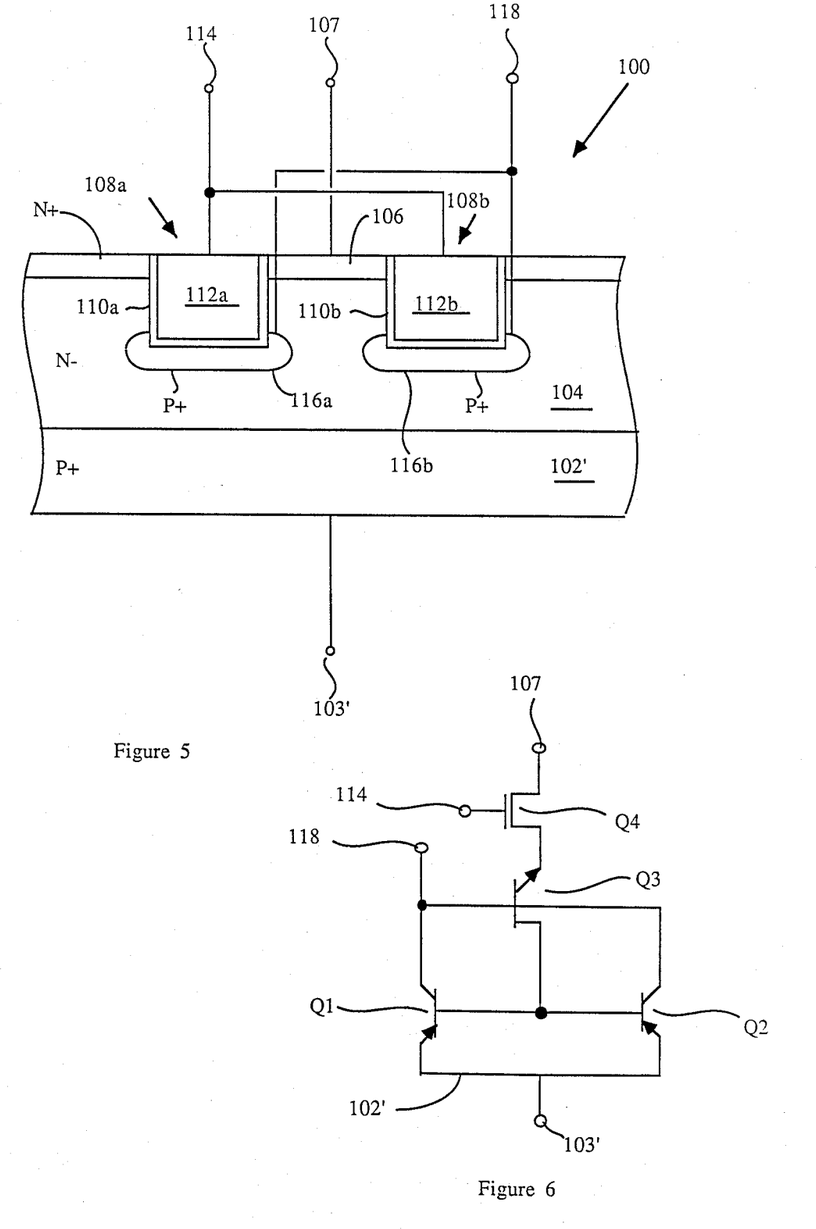
FIG. 5 illustrates a transistor constructed in accordance with another embodiment of our invention.
FIG. 6 schematically illustrates the structure of FIG. 5.

FIG. 5 illustrates a transistor constructed in accordance with another embodiment of our invention in which N− layer 104 is formed on a P+ substrate 102' instead of N+ substrate 102. The structure of FIG. 5 functions in a manner similar to a static induction thyristor. (Static induction thyristors are discussed by Nakamura et al. in "Very High Speed Static Induction Thyristor", published in IEEE Transactions on Industry Applications, November, 1986, pages 1000 to 1006, incorporated herein by reference, and by Kajiwara et al. in "High Speed High Voltage Static Induction Thyrister", published at the IEEE International Electronic Devices Meeting in 1977 also incorporated herein by reference.

FIG. 6 schematically illustrates the equivalent circuit of the structure of FIG. 5. P+ region 116a, N− layer 104 and P+ substrate 102' serve as the collector, base and emitter respectively of a PNP transistor Q1, while P+ region 116b, N− layer 104 and P+ substrate 102' serve as the collector, base and emitter respectively of PNP transistor Q2. P+ regions 116a and 116b also serve as the gate of a JFET Q3. the portion of N− layer 104 below and above P+ gates 116a, 116b serve as the drain and source, respectively of JFET Q3. Gates 112a, 112b serve as the gate of MOS transistor Q4 while N+ region 106 serves as the source of transistor Q4. As can be seen, transistors Q3 and Q4 control the amount of base current permitted to flow out of transistors Q1 and Q2. When transistors Q3 and Q4 are both on, transistors Q1 and Q2 are on, thereby permitting current to flow between P+ substrate 102' and regions 116a, 116b. Of importance, when transistors Q1 and Q2 are on, transistors Q1 and Q2 provide a low impedance path between leads 103' and 118. When transistors Q3 and Q4 are off, current is not permitted to flow between leads 103' and 118. When transistor Q3 is on, the amount of current permitted to flow from the base regions of transistors Q1, Q2 can be controlled by applying selected voltages to gates 112a, 112b.

While the invention has been described with regard to specific embodiments, those skilled in the art with recognize that changes can be made in form and detail without departing from the spirit and scope of the invention. For example, semiconductor materials other than silicon can also be used. In addition, P channel devices can be formed by reversing the conductivity types of the various regions formed in the wafer. Also, the transistor of the present invention can be operated in an inverse mode wherein substrate 102 is the transistor source while N+ region 106 serves as the drain. Accordingly, all such changes come within the present invention.

We claim:

1. A semiconductor device comprising:
   a first region of semiconductor material having a first conductivity type;
   a plurality of grooves extending through at least a portion of said first region;
   a plurality of regions of conductive material, each region of conductive material being formed in an associated one of said grooves, said regions of conductive material serving as a first gate, said conductive material being insulated from said first region; and
   a plurality of regions of a second conductivity type formed in said first region, each one of said regions of said second conductivity type being formed underneath an associated one of said grooves and serving as a second gate.

2. The device of claim 1 wherein said first region has a first dopant concentration, said structure further comprising:
   a second region of said first conductivity type formed on said first region, said second region having a second dopant concentration greater than said first dopant concentration, said plurality of grooves extending through said second region; and
   a third region of said first conductivity type and a third dopant concentration greater than said first dopant concentration, said first region being formed on said third region.

3. The device of claim 1 wherein said first region is formed on a second region of semiconductor material of said second conductivity type.

4. The device of claim 1 wherein a junction is formed between each of said plurality of regions of a second conductivity type and said first region, said device further comprising means for forward biasing said junction between each of said plurality of regions of said second conductivity type and said first region such that the electrical resistance exhibited by said first region is reduced.

5. The device of claim 1 wherein a junction is formed between each of said plurality of regions of second conductivity type and said first region, said device further comprising means for reverse-biasing said junction between each of said plurality of regions of said second conductivity type and said first region such that the size of the depletion region at said junction increases.

6. The device of claim 1 further comprising:
   an additional groove extending through at least one of said plurality of regions of conductive material, said additional groove being lined with an insulating layer, said insulating layer including an opening at the bottom of said additional groove to thereby expose one of said regions of said second conductivity type; and
   a conductive layer electrically contacting said one of said regions of said second conductivity type.

7. The device of claim 1 wherein an additional region of conductive material is formed in at least one of said grooves, said additional region of conductive material electrically contacting at least one of said regions within said plurality of regions of said second conductivity type.

8. The device of claim 7 wherein said additional region is not electrically connected to any of the regions within said plurality of regions of conductive material.

* * * * *

UNITED STATES PATENT AND TRADEMARK OFFICE
CERTIFICATE OF CORRECTION

PATENT NO. : 4,835,586
DATED : May 30, 1989
INVENTOR(S) : Adrian I. Cogan; Richard A. Blanchard It is certified that error appears in the above-identified patent and that said Letters Patent is hereby corrected as shown below:

In the list of references cited, cover page, second column, irst line, "Thristor" should read --Thyristor--.

In Col. 3, line 19, "Large" should read --Larger--.
In Col. 3, line 33, "N+] silicon" should read --N+ silicon--.
In Col. 7, line 8, "Q3. the" should read --Q3. The--.
In Col. 7, line 27, "with" should read --will--.

Signed and Sealed this

Twenty-fourth Day of April, 1990

Attest:

HARRY F. MANBECK, JR.

Attesting Officer

Commissioner of Patents and Trademarks